(12) United States Patent
Ren

(10) Patent No.: US 9,806,686 B1
(45) Date of Patent: Oct. 31, 2017

(54) LINEAR VARIABLE GAIN AMPLIFIER

(71) Applicant: INPHI CORPORATION, Santa Clara, CA (US)

(72) Inventor: Guojun Ren, San Jose, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/272,828

(22) Filed: Sep. 22, 2016

(51) Int. Cl.
    *H03F 3/45*     (2006.01)
    *H03F 3/191*     (2006.01)
    *H03G 1/00*     (2006.01)

(52) U.S. Cl.
    CPC ....... *H03G 1/0029* (2013.01); *H03F 3/45179* (2013.01); *H03F 2203/45022* (2013.01); *H03F 2203/45154* (2013.01)

(58) Field of Classification Search
    USPC .................................................. 330/252–261
    See application file for complete search history.

(56) References Cited

U.S. PATENT DOCUMENTS 7,034,606 B2 * 4/2006 Caresosa ............. H03F 3/45188
    327/563
7,554,404 B2 * 6/2009 Roufoogaran .......... H03F 3/211
    330/253

* cited by examiner

*Primary Examiner* — Hieu Nguyen
(74) *Attorney, Agent, or Firm* — Richard T. Ogawa; Ogawa P.C.

(57) ABSTRACT

The present invention is directed to electrical circuits and techniques thereof. More specifically, an embodiment of the present invention provides a variable gain amplifier that includes a first transistor and a second transistor whose gate terminals are coupled to a first input terminal. A first drain terminal of the first transistor and a first source terminal of the second transistor is coupled to a voltage gain control switch. There are other embodiments as well.

20 Claims, 7 Drawing Sheets

LINEAR VARIABLE GAIN AMPLIFIER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits and techniques thereof.

A variable gain amplifier (VGA) has many applications. Typically, variable-gain or voltage-controlled amplifier is an electronic amplifier that varies its gain depending on a control voltage (CV). VGAs have many applications, including audio level compression, synthesizers, amplitude modulation, and others. For example, a VGA can be implemented by first creating a voltage-controlled resistor (VCR), which is used to set the amplifier gain. The VCR can be produced by one or more transistors with simple biasing. In certain implementation, VGA are implemented using operational transconductance amplifiers. Sometimes, VGAs are implemented for automatic gain control (AGC) applications. Typically, VGA performance can be measured in terms of gain range, linearity of electrical characteristics, and bandwidth.

Over the past, many types of conventional variable gain amplifiers have been proposed and implemented in different applications. Unfortunately, existing variable gain amplifiers are inadequate, as explained below. It is thus desirable to have new and improved variable gain amplifiers.

BRIEF SUMMARY OF THE INVENTION

The present invention is directed to electrical circuits and techniques thereof. More specifically, an embodiment of the present invention provides a variable gain amplifier that includes a first transistor and a second transistor whose gate terminals are coupled to a first input terminal. A first drain terminal of the first transistor and a first source terminal of the second transistor is coupled to a voltage gain control switch. There are other embodiments as well.

According to an embodiment, the present invention provides a variable gain amplifier (VGA) device, which includes a first input terminal and a second input terminal. The device also includes a first NMOS switch comprising a first source terminal, a first drain terminal, and a first gate terminal. The first gate terminal is coupled to the first input terminal. The device further includes a second NMOS switch comprising a second source terminal, a second drain terminal, and a second gate terminal. The second drain terminal is coupled to the first source terminal. The second source terminal is coupled to a ground terminal. The second gate terminal is coupled to the first input terminal. The device additionally includes a third NMOS switch comprising a third drain terminal, a third source terminal, and a third gate terminal. The third gate terminal is coupled to the second input terminal. The device further includes a fourth NMOS switch comprising a fourth drain terminal, a fourth source terminal, and a fourth gate terminal. The fourth gate terminal is coupled to the second input terminal. The fourth source terminal is coupled to the ground terminal. The device also includes a voltage control module comprising a control terminal. The voltage control module is coupled to the first source terminal and the second drain terminal.

According to another embodiment, the present invention provides a variable gain amplifier (VGA) device, which has a first input terminal and a second input terminal. The device further includes a first NMOS switch comprising a first source terminal, a first drain terminal, and a first gate terminal. The first gate terminal is coupled to the first input terminal. The device also includes a second NMOS switch comprising a second source terminal, a second drain terminal, and a second gate terminal. The second drain terminal is coupled to the first source terminal. The second source terminal is coupled to a ground terminal. The second gate terminal is coupled to the first input terminal. The device additionally includes a third NMOS switch comprising a third drain terminal, a third source terminal, and a third gate terminal. The third gate terminal is coupled to the second input terminal. The device further includes a fourth NMOS switch comprising a fourth drain terminal, a fourth source terminal, and a fourth gate terminal. The fourth gate terminal is coupled to the second input terminal. The fourth source terminal is coupled to the ground terminal. The device additionally includes a fifth NMOS switch comprising a fifth drain terminal, a fifth source terminal, and a fifth gate terminal. The fifth gate terminal is coupled to a voltage control terminal. The fifth source terminal is coupled to the first source terminal and the second drain terminal. The fifth drain terminal is coupled to the third source terminal and the second drain terminal.

According to yet another embodiment, the present invention provides A variable gain amplifier (VGA) device, which has a first input terminal and a second input terminal. The device also includes a first load resistor and a second load resistor. The device further includes a first PMOS switch comprising a first source terminal, a first drain terminal, and a first gate terminal. The first gate terminal is coupled to the first input terminal. The device also includes a second PMOS switch comprising a second source terminal, a second drain terminal, and a second gate terminal. The second source terminal is coupled to the first drain terminal. The second drain terminal is coupled to the first load resistor. The second gate terminal is coupled to the first input terminal. The device further includes a third PMOS switch comprising a third drain terminal, a third source terminal, and a third gate terminal. The third gate terminal is coupled to the second input terminal. The device additionally includes a fourth PMOS switch comprising a fourth drain terminal, a fourth source terminal, and a fourth gate terminal. The fourth gate terminal is coupled to the second input terminal. The fourth drain terminal is coupled to the second load resistor. The device additionally includes a voltage control module comprising a control terminal. The voltage control module is coupled to the first drain terminal and the second source terminal.

It is to be appreciated that embodiments of the present invention provide many advantages over conventional techniques. As explained below, variable gain amplifiers according to embodiments of the present invention provide improved linearity in both gain and impedance characteristics, especially at low-gain (e.g., less than 10 dB) operating conditions. Additionally, variable gain amplifiers according to embodiments of the present invention provide lower gain error and less distortion compared to conventional VGAs.

Embodiments of the present invention can be implemented in conjunction with existing systems and processes. For example, variable gain amplifiers according to embodiments of the present invention can be used in lieu of conventional VGAs in many applications. Additionally, VGAs according to embodiments of the present invention can be manufactured using existing manufacturing techniques, processes, and equipment. There are many other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits and techniques thereof. More specifically, an embodiment of the present invention provides a variable gain amplifier that includes a first transistor and a second transistor whose gate terminals are coupled to a first input terminal. A first drain terminal of the first transistor and a first source terminal of the second transistor is coupled to a voltage gain control switch. There are other embodiments as well.

Figure 1:
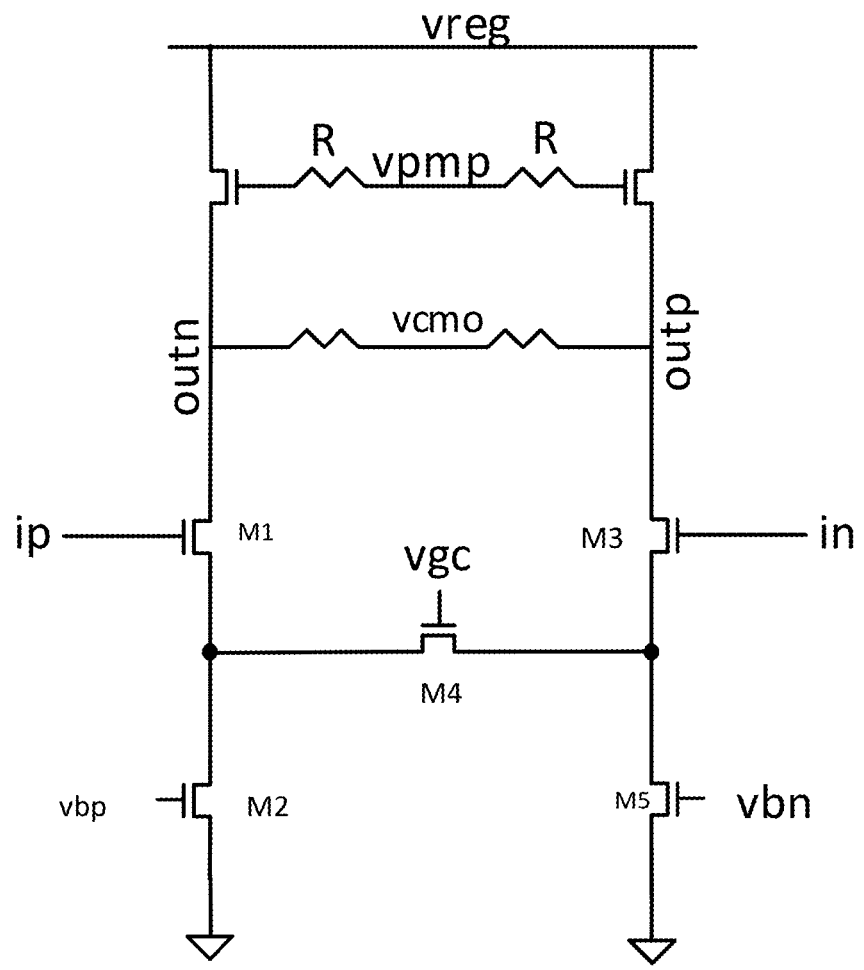
FIG. 1 is a simplified diagram illustrating a conventional variable gain amplifier device.

As explained above, variable gain amplifiers have wide range of applications. Depending on the application and implementation, variable gain amplifiers have also been referred to as programmable gain amplifier (PGA), automatic gain control (AGC), and voltage controlled amplifier (VCA). For example, FIG. 1 is a simplified diagram illustrating a conventional variable gain amplifier device. As shown in FIG. 1, a variable gain amplifier device includes a pair of input switches (switch M1 and switch M3). The gate of the switch M1 is coupled a positive input "ip". The gate of the switch M3 is coupled to a negative input "in". The variable gain amplifier also includes a pair of bias switches (switch M2 and switch M5). The gate of switch M5 is coupled to a negative bias "vbn". The gate of switch M2 is coupled to a positive bias "vbp". The switch M4 adjusts the gain of the variable gain amplifier. The gate of switch M4 is coupled to a variable gain control "vgc" signal. As an example, the variable gain amplifier device FIG. 1 is implemented using NMOS transistors as switches. For example, drain terminals of switches M1 and M3 are respectively coupled to output terminals "outn" and "outp". Gates of switch M2 and switch M5 are respectively connected to bias voltages "vbp" and "vbn". The gain control switch M4 is configured to adjust the system gain. More specifically, the gain control switch M4 changes the voltage at the supply terminals of NMOS transistors M1 and M3. Unfortunately, the output impedance of the gain control switch M4 (e.g., implementing using a NMOS transistor) is dependent upon input amplitude (e.g., at switches M1 and M3), and thus adversely affecting the system linearity and performance. For example, the effective transconductance $g_{meff}$ for the system can be expressing by Equation 1 below:

$$g_{meff} = \frac{g_{m1}}{1 + (g_{m1} + g_{mbs1} + g_{o1})/(g_{o2} + 2g_{o4})} \quad \text{Equation 1}$$

In Equation 1, $g_{m1}$ is the transconductance (controlled by vgs) of switch M1, $g_{mbs1}$ is the bulk transconductance (controlled by vsb) of switch M1, $g_{o1}$ is the source degeneration associated with switch M1, $g_{o2}$ is the source degeneration associated with switch M2, and $g_{o4}$ is the source degeneration associated with switch M4. In practice, Equation 1 can be simplified as $g_{mbs1}$, $g_{o1}$, and $g_{o2}$ have relatively small affect to the effective gain of the system, and the effective transconductance $g_{meff}$ of the system can be expressed using Equation 2 below:

$$g_{meff} \cong \frac{g_{m1}}{1 + g_{m1}/(2g_{o4})} \quad \text{Equation 2}$$

Further simplification of Equation yields Equation 3, for signal operating at low gain thus eliminating negligibly small element in Equation 2 below:

$$g_{meff} \cong g_{o4} \quad \text{Equation 3:}$$

Based on Equation 3, it can be seen the effective system transconductance $g_{meff}$ is substantially related to the source generation characteristic of the gain control switch M4. For example, source degeneration of the gain control switch M4 helps make the system transconductance more linear (i.e., degenerate the $g_{m1}$ and $g_{m2}$ characteristics). However, the drawback of this approach is that the output impedance of NMOS switch M4 depends on the input amplitude, and this dependency adversely affect system performance and overall linearity. More importantly, the source generation characteristic of switch M4 is inherently non-linear, especially when operating in low-gain modes, and thus having effective transconductance closely tied to the electrical characteristics of switch M4 is undesirable. It is to be appreciated that embodiments of the present invention provide variable gain amplifiers that provide improved linearity and performance, where the effective gain at low gain setting does not depend on the characteristics of the variable gain switch M4.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
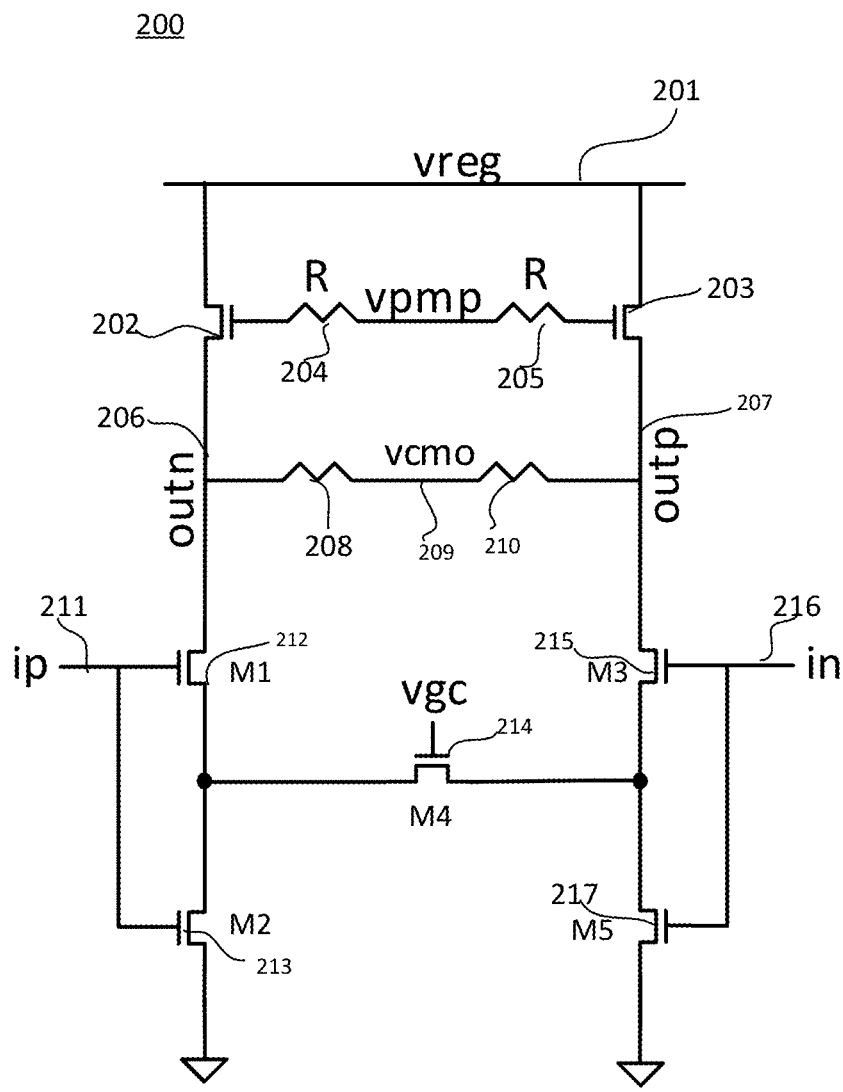
FIG. 2 is a simplified diagram illustrating a variable gain amplifier with adaptive bias according to an embodiment of the present invention.
Figure 4:
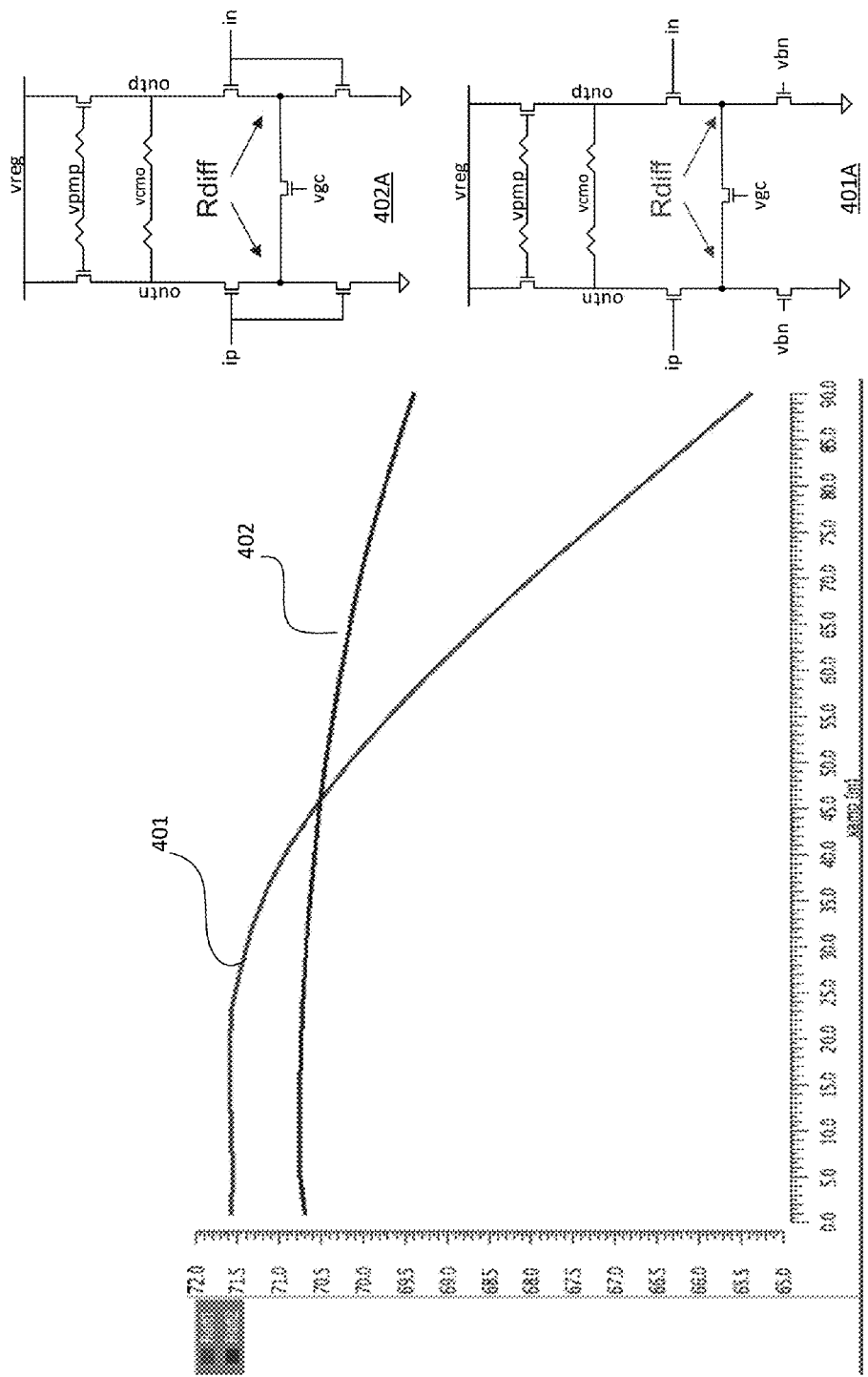
FIG. 4 is graph comparing impedance linearity between a conventional variable gain amplifier and a variable gain amplifier according to an embodiment of the present invention.

FIG. 2 is a simplified diagram illustrating a variable gain amplifier with adaptive bias according to an embodiment of the present invention. This diagram is merely an example, which should not unduly limit the scope of the claims. One of ordinary skill in the art would recognize many variations, alternatives, and modifications. As shown in FIG. 2, a variable gain amplifier system 200 includes an amplifier section that is implemented using NMOS transistors. It is to be appreciated that other types of transistors (e.g., PMOS) can be used to implement variable gain amplifiers according to embodiments of the present invention. For example, the variable gain amplifier illustrated in FIG. 4 is implemented using PMOS transistors.

Switch 214 (M4) provides gain control signal for the system gain value. For example, the input gain control signal is received at the gate terminal of switch 214, and changes in input gain control signal affect the effective gain of the system by changing the voltage for the source terminals of switch 212 (M1) and switch 215 (M3). As an example, switch 214 is implemented using an NMOS transistor and functions as a voltage controlled resistor. Depending on the implementation, switch 214 can be implemented using other types of electrical components. It is to be appreciated that transistors often provide better linearity than resistors. As an example, switches 212, 213, 215, and 217 are implemented using NMOS transistors. In various embodiments, switching transistors are selected to be matching. More specifically, switch 212 and switch 215 are matched in their electrical characteristics (e.g., transconductance, gain, etc.). Similarly, switch 213 and switch 217 are matched in their respective electrical characteristics. For example, switches 212 and 215 are characterized by a greater (e.g., 5~10 times or even greater) transconductance than the transconductance of switches 213 and 217.

As shown in FIG. 2, the gate of switch 212 (M1) is coupled to positive input terminal 211 ("ip"), and the gate of switch 215 (M3) is couple to negative input terminal 216 ("in"). The drain terminal of switch 212 is coupled to negative output terminal 206 ("outn"), and the drain terminal of switch 215 is coupled to the positive output terminal 207 ("outp"). A pair of common mode resistors 208 and 210 is provided between the negative output terminal 206 and the positive output terminal 207. For example, a common mode voltage 209 ("vcom") is provided between common mode resistors 208 and 210. The output terminals 206 and 207 are respectively coupled to switch 202 and switch 203, which are coupled to a regulator voltage 201 ("vreg"). In addition, the gate of switch 202 is coupled to pump resistor 204, and the gate of switch 203 is coupled to pump resistor 205. A pump voltage terminal is configured between the pump resistors 204 and 205 as shown in FIG. 2.

As explained above, an important drawback of conventional variable gain amplifiers (e.g., VGA illustrated in FIG. 1) is the nonlinearity, especially operating at low-gain situations, attributed to the dependence of gain control switch to the input amplitude. More specifically, the system effective transconductance $g_{meff}$ for variable gain amplifier 200 illustrated in FIG. 2, operating in low-gain situations, is no not based on the electrical characteristics of the gain control switch 214 (M4). Switches M2 and M5, which are implemented using NMOS transistors, are configured with adaptive bias. More specifically, the gate of switch 213 (M2) is coupled to positive input terminal 211, and the gate of switch 217 (M5) is coupled to the negative input terminal 216. Instead of relying on bias voltages (as illustrated in FIG. 1), switches 213 and 217 rely on input voltages to adjust their gate voltages. More specifically, the gate of switch 213 and the gate of switch 212 are both coupled to input terminal 211 ("ip") as shown; the gate of switch 215 and the gate of switch 217 are both coupled to input terminal 216 ("in"). For the variable gain amplifier 200 illustrated in FIG. 2, the system transconductance $g_{meff}$ can be approximate by Equation 4 below:

$$g_{meff} \cong \frac{g_{m2} + 2g_{o4}}{1 + 2g_{o4}/g_{m1}} \quad \text{Equation 4}$$

When operating at low gain levels (e.g., below 10 dB), Equation 4 can be simplified and expressed as Equation 5:

$$g_{meff} \cong g_{m2} \quad \text{Equation 5:}$$

It is to be appreciated that the effective system transconductance $g_{meff}$ for VGA 200 is based on the $g_{m2}$, which is the transconductance of switch 213 (M2). Since switch 213 and switch 217 are matched, the effective system gain $g_{meff}$ can be based on the $g_{m5}$ as well, which is the transconductance of switch 217 (M5). It is to be appreciated that $g_{m2}$ (or $g_{m5}$) is much more linear than $g_{m4}$ (source degeneration characteristic of switch 214). More specifically, $g_{m4}$ is dependent on the input amplitude, whereas $g_{m2}$ of switch 213 (or $g_{m5}$ of switch 217) does not dependent on input amplitude. For example, operating at a system gain range of about −5 dB to about 10 dB, the $g_{meff}$ and $g_{m2}$ values are substantially linear for substantially the entire frequency range. For example, the effective system transconductance $g_{meff}$ of VGA 200 is substantially linear at an input voltage level below 1V (e.g., 0.1V to 1V). By using the architecture illustrated in FIG. 2, system transconductance $g_{meff}$ is substantially compensated with switches 213 and 217 coupled to the input terminals.

As shown in FIG. 2, the drain terminal of switch 212 is coupled to negative output 206 "outn" and the drain terminal of switch 215 is coupled to positive output 207 "outp". Common mode resistors 208 and 210 are configured between outputs 206 and 207. The common mode voltage 209 is provided between resistors 208 and 210. The source terminals of switches (e.g., NMOS transistors) 202 and 203 are respectively coupled to outputs 206 and 207. The drain terminals of switches 202 and 203 are coupled to regulator voltage 201 ("vreg"). Gates of switches 202 and 203 are respectively coupled to pump resistors 204 and 205. Depending on the specific implementation, configuration for common mode resistors and pump resistors may be modified.

Figure 3:
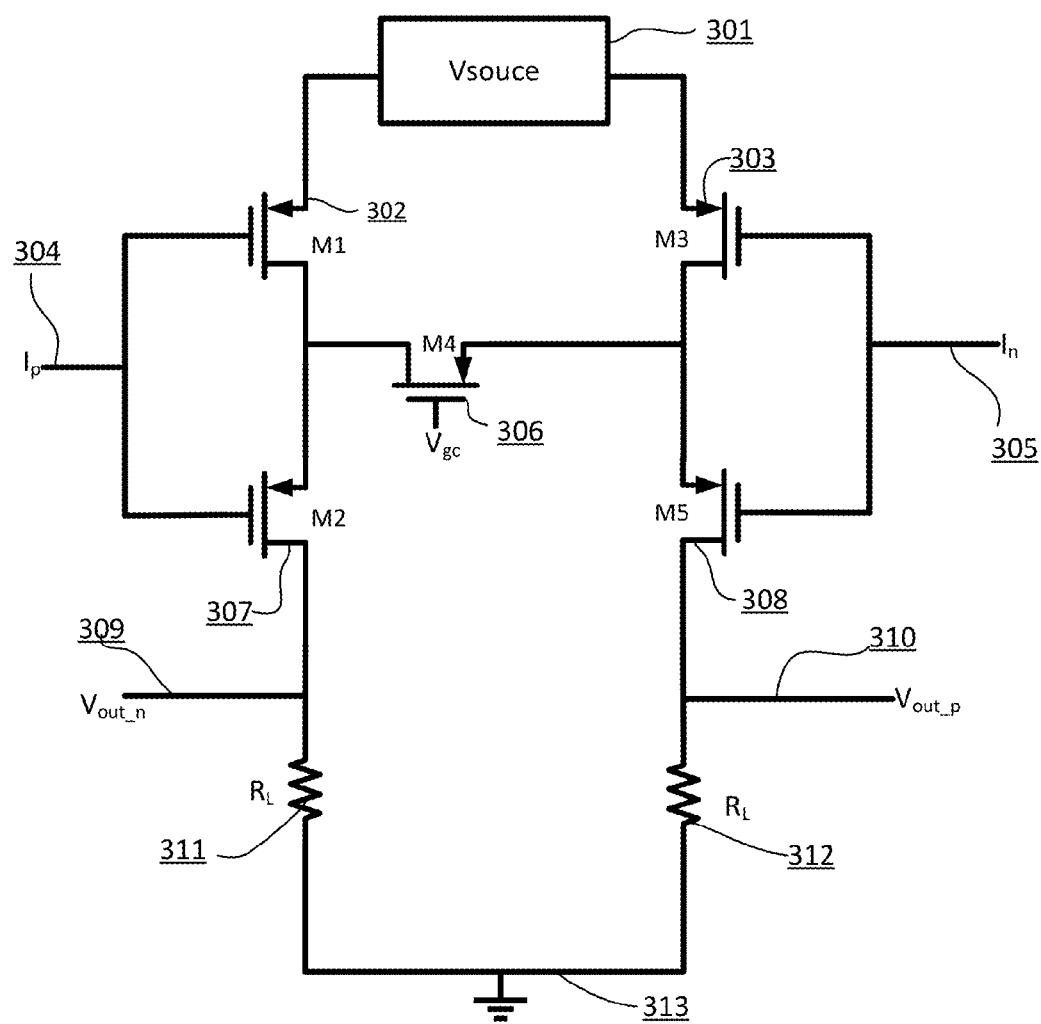
FIG. 3 is a simplified diagram illustrating an adaptive variable gain amplifier 300 with PMOS transistors according to an embodiment of the present invention.

FIG. 3 is a simplified diagram illustrating an adaptive variable gain amplifier 300 with PMOS transistors according to an embodiment of the present invention. This diagram is merely an example, which should not unduly limit the scope of the claims. One of ordinary skill in the art would recognize many variations, alternatives, and modifications. As shown in FIG. 3, variable gain amplifier 300 includes input switch 302 ("M1") and input switch 303 ("M3"). Source terminals of switches 302 and 303 are coupled to voltage source 301. Depending on the implementation, voltage source can be implemented in many ways. For example, the voltage source 301 provides a DC voltage for operation. The gate terminal of switch 302 is coupled to positive input terminal 304 ("$I_p$"). The gate terminal of switch 303 is coupled to negative terminal 305 ("$I_n$"). The drain terminals of switches 302 and 303 are coupled to switch 306 ("M4"). For example, switch 306 receive voltage control signal $V_{gc}$ at its gate terminal. As explained above, switch 306 functions as voltage controlled resistor that changes adjusts the system gain. Variable gain amplifier 300 also includes bias switch 307 ("M2") and bias switch 308 ("M5"). More specifically, source terminals of switches 307 and 308 are respectively coupled to the drain and source terminals of switch 306. The gate terminal of switch 307 is coupled to positive input terminal 304. The gate terminal of switch 308 is coupled to negative input terminal 305.

It is to be appreciated that, similar to variable gain amplifier 200 illustrated in FIG. 2, the biasing and operations of switches 302 and 303 are in large part dictated by signals received at input terminals 304 and 305, as opposed to bias current sources used in conventional systems. The effective transconductance $g_{meff}$ of VGA 300 is approximately equal to the transconductance of switches 302 and 303, where the electrical characteristics of these two switches are matched. It is to be appreciated that at when operating at low gain (e.g., less than 10 dB) situations, gain characteristics of switches 302 and 303 are much more linear than the electrical characteristics (e.g., source degeneration properties) of switch 306.

Switches 307 and 308 provide amplification for variable gain amplifier 300, and the system output is provided at the drain terminals of switches 307 and 308. More specifically, the drain terminal of switch 307 is coupled to negative output terminal 309 ($V_{out\_n}$) and load resistor 311. The drain terminal of switch 308 is coupled to positive output terminal 310 ($V_{out\_p}$) and load resistor 312. According to various embodiments, switches 307 and 308 are a matched pair, and load resistors 311 and 312 are a matched pair. As shown in FIG. 3, load resistors 311 and 312 are coupled to ground terminal 313.

Variable gain amplifier 300 is implemented using PMOS transistors as switches. More specifically, switches 303, 303, 306, 307, and 308 comprise NMOS transistors. Switches 302 and 303 are a matched pair. Switches 307 and 308 are also a matched pair. In a specific embodiment, switches 307 and 308 are characterized by a higher level (e.g., 5 to 10 times higher) of transconductance than that of switches 302 and 303. It is to be appreciated that VGA 300 is capable of providing a high degree of linearity at low gain (e.g., −5 dB to 10 dB) situations for essentially the entire operating frequency range.

FIG. 4 is graph comparing impedance linearity between a conventional variable gain amplifier and a variable gain amplifier according to an embodiment of the present invention. The horizontal axis indicates input amplitude and the vertical axis indicates differential impedance. For example, curve 402 corresponds to system 402A, and curve 401 corresponds to system 401A. For example, system 402A is an exemplary system according to an embodiment of the present invention. System 401A is a conventional system. As can be seen in FIG. 4, differential impedance (as represented by curve 402) of system 402A is more linear and "flatter" (change being less than 1 through the input amplitude range) than the differential impedance (as represented by curve 401) of system 401A.

Figure 5:
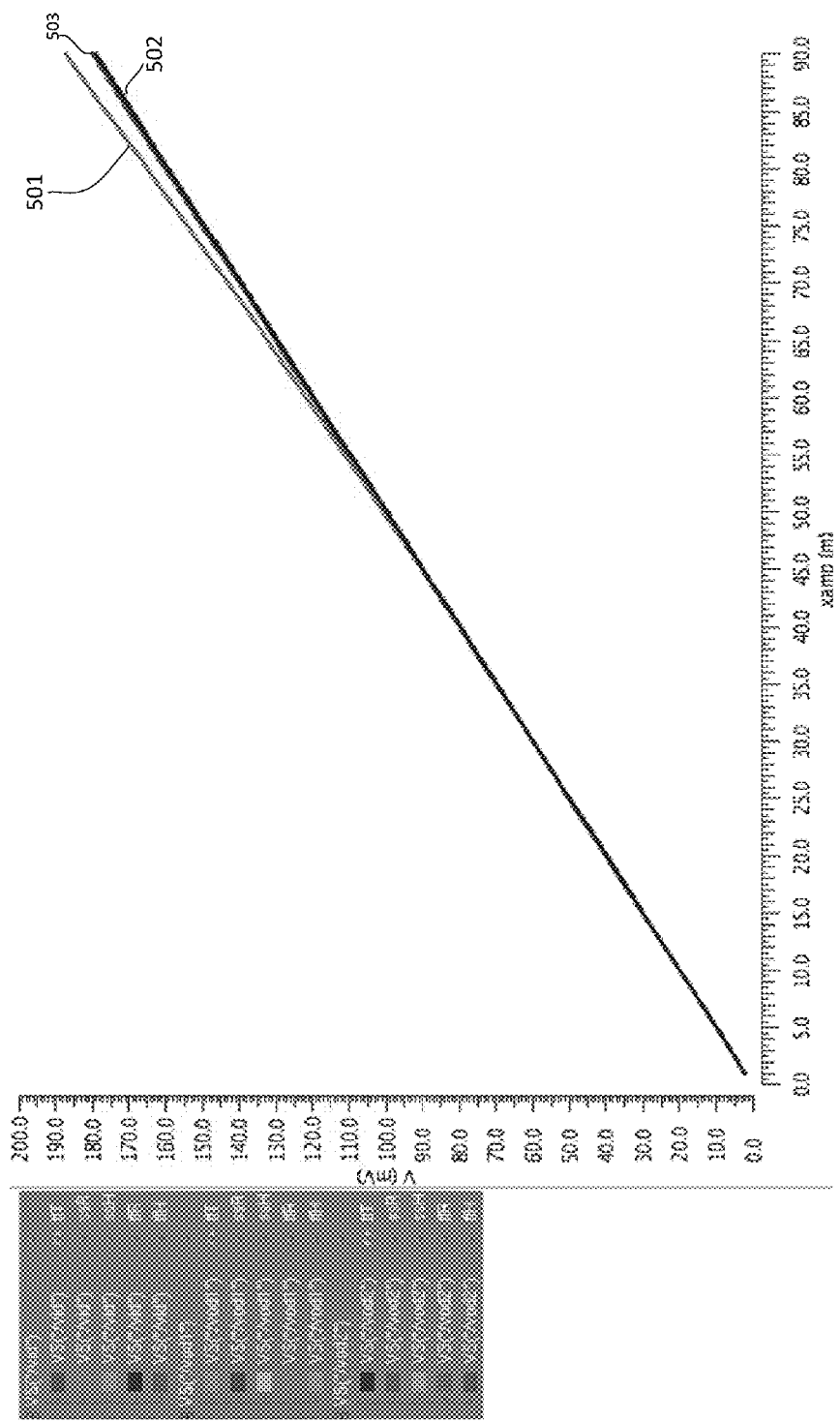
FIG. 5 is graph comparing DC transfer function between a conventional variable gain amplifier and a variable gain amplifier according to an embodiment of the present invention.

FIG. 5 is graph comparing DC transfer function between a conventional variable gain amplifier and a variable gain amplifier according to an embodiment of the present invention. Curve 501 is associated with a conventional variable gain amplifier device. Curve 502 is associated with a variable gain amplifier device according an embodiment of the present invention. Curve 503 depicts an ideal performance curve. Curve 502 deviates much from ideal curve 503 and has a gain expansion at low-gain operations, which can be attributed to gain control transistor (e.g., switch M4 in FIG. 1) impedance ($r_{ds}$) being reduced at high input swing. In contrast, curve 502 is very close to the ideal curve 503.

Figure 6:
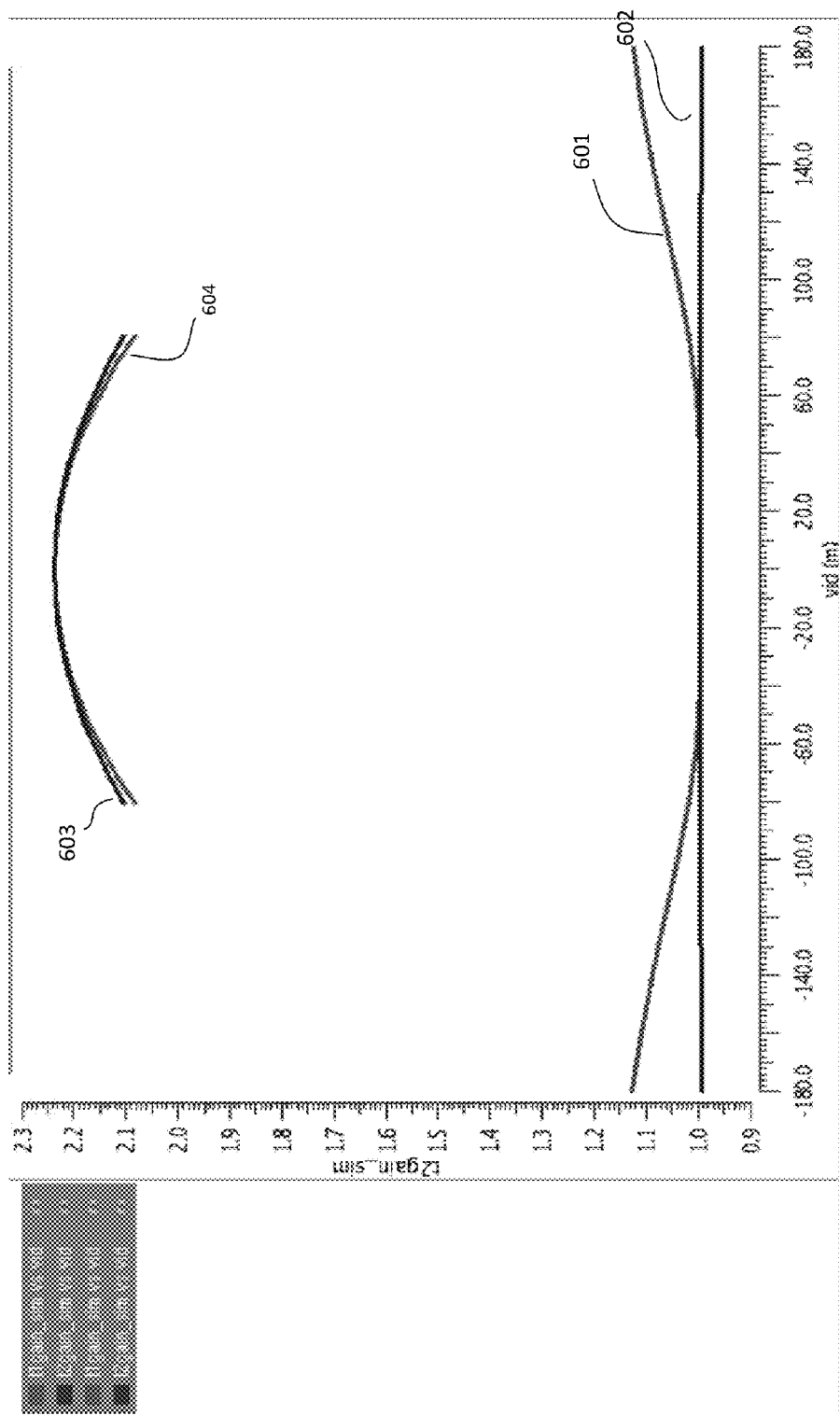
FIG. 6 is graph comparing gain error between a conventional variable gain amplifier and a variable gain amplifier according to an embodiment of the present invention.

FIG. 6 is graph comparing gain error between a conventional variable gain amplifier and a variable gain amplifier according to an embodiment of the present invention. Curve 601 represents at the gain error of a conventional variable gain amplifier at 0 dB. Curve 602 represents the gain error of a variable gain amplifier according to an embodiment of the present invention at 0 dB. It is clear that at low-gain (e.g., 0 dB) operations, the variable gain amplifier according to the present invention offer a clear advantage over conventional variable gain amplifier. Curve 604 represents at the gain error of a conventional VGA at 7 dB. Curve 603 represents the gain error of a variable gain amplifier according to an embodiment of the present invention at 7 dB. Again, the variable gain amplifier according to the present invention offer an advantage over a conventional variable gain amplifier, but the difference is not as prominent.

Figure 7:
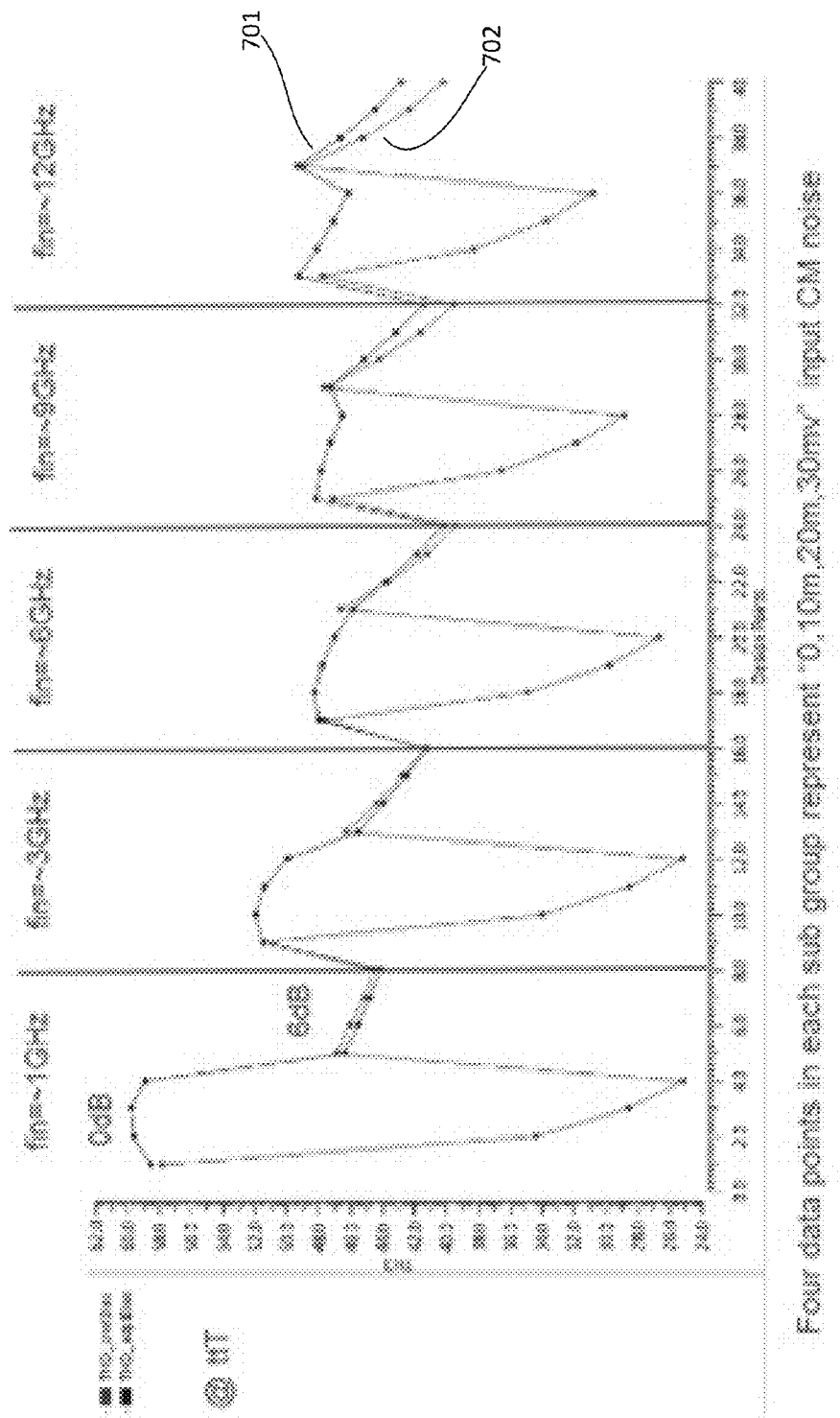
FIG. 7 comparing total harmonic distortion between a conventional variable gain amplifier and a variable gain amplifier according to an embodiment of the present invention.

FIG. 7 comparing total harmonic distortion between a conventional variable gain amplifier and a variable gain amplifier according to an embodiment of the present invention. Curve 701 is a total harmonic distortion (THD) curve for a variable gain amplifier according to an embodiment of the present invention. Curve 702 is a TDH curve for a conventional variable gain amplifier. As can be clearly seen in FIG. 7, variable gain amplifiers according to embodiments of the present invention exhibit a much lower level of THD at various operating frequencies (i.e., 1 GHz, 3 GHz, 6 GHz, 9 GHz, and 12 GHz) than conventional VGAs, hence better performance.

It is to be understood that while graphs in FIGS. 4-7 demonstrate advantages of VGAs according to embodiments of the present invention, there are many advantages. Additionally, variable gain amplifier according to embodiment of the present invention can be implemented in different ways. There are other embodiments as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A variable gain amplifier (VGA) device comprising:
   a first input terminal and a second input terminal;
   a first NMOS switch comprising a first source terminal, a first drain terminal, and a first gate terminal, the first gate terminal being coupled to the first input terminal;
   a second NMOS switch comprising a second source terminal, a second drain terminal, and a second gate terminal, the second drain terminal being coupled to the first source terminal, the second source terminal being coupled to a ground terminal, the second gate terminal being coupled to the first input terminal;
   a third NMOS switch comprising a third drain terminal, a third source terminal, and a third gate terminal, the third gate terminal being coupled to the second input terminal;
   a fourth NMOS switch comprising a fourth drain terminal, a fourth source terminal, and a fourth gate terminal, the fourth gate terminal being coupled to the second input terminal, the fourth source terminal being coupled to the ground terminal; and
   a voltage control module comprising a control terminal, the voltage control module being coupled to the first source terminal and the second drain terminal.

2. The device of claim 1 wherein the voltage control module further being coupled to the third source terminal and the fourth drain terminal.

3. The device of claim 1 wherein the voltage control module comprises a fifth source terminal and a fifth drain terminal, the fifth source terminal being coupled to the first source terminal and the second drain terminal, the fifth drain terminal being coupled to the third source terminal and the fifth drain terminal.

4. The device of claim 1 further comprising a first output terminal and a second output terminal, the first output terminal being coupled to the first drain terminal, the second output terminal being coupled to the third drain terminal.

5. The device of claim 1 further comprising a load resistor coupled to the first drain terminal.

6. The device of claim 1 wherein the voltage control module comprises an NMOS transistor, a gate terminal of the NMOS transistor being coupled to the control terminal.

7. The device of claim 1 wherein the voltage control module comprises an NMOS transistor, the NMOS transistor comprising a fifth source terminal and a fifth drain terminal, the fifth source terminal being coupled to the first source terminal and the second drain terminal, the fifth drain terminal being coupled to the third source terminal and the fourth drain terminal.

8. The device of claim 1 further comprising a fifth switch, the first drain terminal being coupled to a voltage source via the fifth switch.

9. The device of claim 8 wherein the fifth switch comprises an NMOS transistor, the NMOS transistor comprising a fifth gate terminal coupled to a pump resistor.

10. The device of claim 8 wherein the fifth switch is coupled to an output terminal.

11. The device of claim 1 wherein the first NMOS switch is characterized by a first transconductance value and the second NMOS switch is characterized by a second transconductance value, the first transconductance value being at least twice larger than the first transconductance value.

12. A variable gain amplifier (VGA) device comprising:
   a first input terminal and a second input terminal;
   a first NMOS switch comprising a first source terminal, a first drain terminal, and a first gate terminal, the first gate terminal being coupled to the first input terminal;
   a second NMOS switch comprising a second source terminal, a second drain terminal, and a second gate terminal, the second drain terminal being coupled to the first source terminal, the second source terminal being coupled to a ground terminal, the second gate terminal being coupled to the first input terminal;
   a third NMOS switch comprising a third drain terminal, a third source terminal, and a third gate terminal, the third gate terminal being coupled to the second input terminal;
   a fourth NMOS switch comprising a fourth drain terminal, a fourth source terminal, and a fourth gate terminal, the fourth gate terminal being coupled to the second input terminal, the fourth source terminal being coupled to the ground terminal; and
   a fifth NMOS switch comprising a fifth drain terminal, a fifth source terminal, and a fifth gate terminal, the fifth gate terminal being coupled to a voltage control terminal, the fifth source terminal being coupled to the first source terminal and the second drain terminal, the fifth drain terminal being coupled to the third source terminal and the second drain terminal.

13. The device of claim 12 further comprising a first common mode resistor configured in series with a second common mode resistor, the first common mode resistor being coupled to the first drain terminal, the second common mode resistor being coupled to the third drain terminal.

14. The device of claim 12 wherein the VGA device is characterized by a first gain value and the fifth NMOS switch is characterized by a second gain value, the first gain value being substantially equal to the second gain value.

15. A variable gain amplifier (VGA) device comprising:
   a first input terminal and a second input terminal;
   a first load resistor and a second load resistor;
   a first PMOS switch comprising a first source terminal, a first drain terminal, and a first gate terminal, the first gate terminal being coupled to the first input terminal;
   a second PMOS switch comprising a second source terminal, a second drain terminal, and a second gate terminal, the second source terminal being coupled to the first drain terminal, the second drain terminal being coupled to the first load resistor, the second gate terminal being coupled to the first input terminal;

a third PMOS switch comprising a third drain terminal, a third source terminal, and a third gate terminal, the third gate terminal being coupled to the second input terminal;

a fourth PMOS switch comprising a fourth drain terminal, a fourth source terminal, and a fourth gate terminal, the fourth gate terminal being coupled to the second input terminal, the fourth drain terminal being coupled to the second load resistor; and a voltage control module comprising a control terminal, the voltage control module being coupled to the first drain terminal and the second source terminal.

16. The device of claim 15 wherein the voltage control module comprises a PMOS transistor.

17. The device of claim 15 wherein the second drain terminal is coupled to a first output terminal and the fourth drain terminal is coupled to a second output terminal.

18. The device of claim 15 wherein the first load resistor is coupled to a ground terminal.

19. The device of claim 15 wherein the first source terminal is coupled to a voltage source.

20. The device of claim 15 the VGA device is characterized by a first gain value and the voltage control module is characterized by a second gain value, the first gain value being substantially equal to the second gain value.

* * * * *